(12) United States Patent
Jung et al.

(10) Patent No.: US 12,352,813 B2
(45) Date of Patent: Jul. 8, 2025

(54) INTEGRATED CIRCUIT AND AN ELECTRONIC DEVICE INCLUDING INTEGRATED CIRCUIT

(71) Applicant: Samsung Electronics Co., Ltd., Suwon-si (KR)

(72) Inventors: Yeon Ho Jung, Suwon-si (KR); Jong Wook Kye, Suwon-si (KR); Min Woo Kwak, Seoul (KR); Mi Joung Kim, Hwaseong-si (KR); Chan Wook Park, Seongnam-si (KR); Do Hoon Byun, Hwaseong-si (KR); Je Kyun Ryu, Seoul (KR); Kwan Seong Lee, Yongin-si (KR); Jae Ho Lee, Incheon (KR); Jae Seung Choi, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 552 days.

(21) Appl. No.: 17/662,327

(22) Filed: May 6, 2022

(65) Prior Publication Data

US 2023/0097976 A1 Mar. 30, 2023

(30) Foreign Application Priority Data

Sep. 27, 2021 (KR) .................. 10-2021-0127124

(51) Int. Cl.
*G01R 31/317* (2006.01)
*H03K 17/693* (2006.01)

(52) U.S. Cl.
CPC . *G01R 31/31712* (2013.01); *G01R 31/31724* (2013.01); *H03K 17/693* (2013.01)

(58) Field of Classification Search
CPC ........ G01R 31/31712; G01R 31/31705; G01R 31/31724; G01R 31/318555;
(Continued)

(56) References Cited

U.S. PATENT DOCUMENTS

| | | | | | |
|---|---|---|---|---|---|
| 5,881,067 | A | * | 3/1999 | Narayanan ..... | G01R 31/318525 324/73.1 |
| 7,139,950 | B2 | * | 11/2006 | Huisman ........ | G01R 31/318536 714/726 |
| 7,278,075 | B2 | * | 10/2007 | Onodera ........ | G01R 31/318536 714/726 |
| 7,284,175 | B2 | * | 10/2007 | Wang ................. | G01R 31/3185 714/727 |

(Continued)

FOREIGN PATENT DOCUMENTS

| | | |
|---|---|---|
| JP | 2003513287 A | 4/2003 |
| KR | 19980032196 A | 7/1998 |
| KR | 20020017646 A | 3/2002 |

*Primary Examiner* — Jeffrey P Aiello
(74) *Attorney, Agent, or Firm* — Myers Bigel, P.A.

(57) ABSTRACT

An integrated circuit and an electronic device including the integrated circuit are provided. An integrated circuit includes a sequential logic circuit, which includes a first scan cell that is configured to receive a scan input, and a plurality of scan cells sequentially connected in series from the first scan cell, a control unit, which is configured to receive a selection signal including an output of each of the plurality of scan cells, and is further configured to output a control signal responsive to the selection signal, and a monitoring circuit, which is configured to receive the control signal, is configured to perform first monitoring of first data at a first node that is an observation node in the sequential logic circuit responsive to the control signal, and is configured to output a result of the first monitoring to a monitoring node.

16 Claims, 12 Drawing Sheets

(58) Field of Classification Search
CPC .... G01R 31/318558; G01R 31/318583; G01R 31/318536; G01R 31/31704; G01R 31/31903; G01R 31/3177; G01R 31/318572; G01R 31/318544; G01R 31/31701; G01R 31/318342; G01R 31/31908; H03K 17/693; H03K 2005/00254; H03K 5/131; G06F 11/263; G06F 11/2733; G06F 11/3656; G06F 30/367; H01L 22/34; H01L 22/20; G01D 18/00; G01D 7/00
USPC .......... 324/73.1, 750.3, 537, 762.02, 762.01, 324/750.01, 763.01, 750.02; 702/120, 702/117, 119, 118, 121, 122, 108, 123, 702/182, 188, 183, 124, 189, 125, 57, 702/126, 85, 84; 703/15, 13, 14, 16, 2; 714/724, 733, 718, 726, 734, 742, 736, 714/30, 725; 716/136, 106, 104, 111, 716/137, 108; 717/124

See application file for complete search history.

(56) References Cited

U.S. PATENT DOCUMENTS

| | | | |
|---|---|---|---|
| 8,301,947 B1* | 10/2012 | Makar | G01R 31/318558 714/729 |
| 9,194,913 B2* | 11/2015 | Goel | G01R 31/318561 |
| 9,383,411 B2* | 7/2016 | Buyuktosunoglu | G01R 31/318536 |
| 10,372,858 B2* | 8/2019 | Odiz | G06F 30/392 |
| 2012/0331361 A1* | 12/2012 | Wang | G01R 31/31926 714/729 |
| 2014/0101500 A1* | 4/2014 | Bastimane | G01R 31/318536 714/E11.155 |

\* cited by examiner

INTEGRATED CIRCUIT AND AN ELECTRONIC DEVICE INCLUDING INTEGRATED CIRCUIT

CROSS-REFERENCE TO RELATED APPLICATION

This application claims priority from Korean Patent Application No. 10-2021-0127124 filed on Sep. 27, 2021 in the Korean Intellectual Property Office, and all the benefits accruing therefrom under 35 U.S.C. 119, the contents of which in its entirety are herein incorporated by reference.

BACKGROUND

1. Field of the Invention

The present invention relates generally to integrated circuits and, more particularly, to an electronic device including an integrated circuit.

2. Description of the Related Art

A scan chain is a technique used in an integrated circuit design technique known as DFT (design for testing). An object thereof is to more easily perform a test by providing a simple method of observing and setting an element (e.g., flip-flop) of a sequential logic portion of an integrated circuit (IC). Elements of the sequential logic are connected to each other in series to form a chain (e.g., a daisy chain). A data Scan_in signal is input to one end of the chain and a data Scan_out signal appears at the other end of the chain. This enables engineers to observe what the values of the elements of the stored sequential logic are, while a circuit is being driven inside the chip.

In general, when the IC operates normally, the elements of the sequential logic in the chain perform their normal logic tasks, and store values as indicated by the logic circuits of which they are a part. After that, the circuit may be interrupted (often during an intermediate computation). Instead of flip-flops connected to the next logic, they are reconfigured to be a part of the scan chain. The test data is an input signal (e.g., scan-in signal) to a head of the scan chain, and the last values stored in the elements of the sequential logic are output to a tail (e.g., scan-out signal) of the scan chain. This allows the test engineer to set the internal values to the intended state and see the internal values, which are generally invisible.

However, if the scan operation at the tail of the scan chain fails, it may not be possible to see all the nodes in the sequential logic due to the form of the scan chain. Therefore, when the scan operation of the scan chain fails, the designer may need to monitor and debug the node that the designer wants to observe.

SUMMARY

Aspects of the present invention may provide an integrated circuit in which a debugging analysis speed for an operation fail of a scan chain may be improved.

Aspects of the present invention may also provide an integrated circuit in which an efficiency of node analysis for nodes other than the scan chain may be improved.

According to an aspect of the present inventive concept, there is provided an integrated circuit comprising, a sequential logic circuit which includes a first scan cell that is configured to receive a scan input, and a plurality of scan cells sequentially connected in series from the first scan cell, a control unit which is configured to receive a selection signal comprising an output of each of the plurality of scan cells, and is further configured to output a control signal responsive to the selection signal, and a monitoring circuit, which is configured to receive the control signal, is configured to perform first monitoring of first data at a first node that is an observation node in the sequential logic circuit responsive to the control signal, and is configured to output a result of the first monitoring to a monitoring node.

According to an aspect of the present inventive concept, there is provided an integrated circuit comprising, a combination circuit, which includes a first node, that is an observation node, and is configured to output first data and normal data at the first node, a sequential logic circuit, which is configured to receive the normal data, and includes a first scan cell that is configured to receive a scan input, and a plurality of scan cells that are sequentially connected in series from the first scan cell, a control unit, which is configured to receive a selection signal comprising an output of each of the plurality of scan cells, and is configured to output a control signal responsive to the selection signal, and a monitoring circuit, which is configured to receive the control signal, is configured to perform first monitoring on the first data at the first node responsive to the control signal, and is configured to output a result of the first monitoring to a monitoring node.

According to an aspect of the present inventive concept, there is provided an electronic device comprising, an integrated circuit, and a power generator, which is configured to provide power to the integrated circuit, and wherein the integrated circuit includes: a sequential logic circuit which includes a first scan cell that is configured to receive a scan input and a plurality of scan cells sequentially connected in series from the first scan cell, a control unit, which is configured to receive a selection signal comprising an output of each of the plurality of scan cells, and is further configured to output a control signal responsive to the selection signal, and a monitoring circuit, which is configured to receive the control signal, is configured to perform first monitoring of first data at a first node that is an observation node in the sequential logic circuit responsive to the control signal, and is configured to output a result of the first monitoring to a monitoring node.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
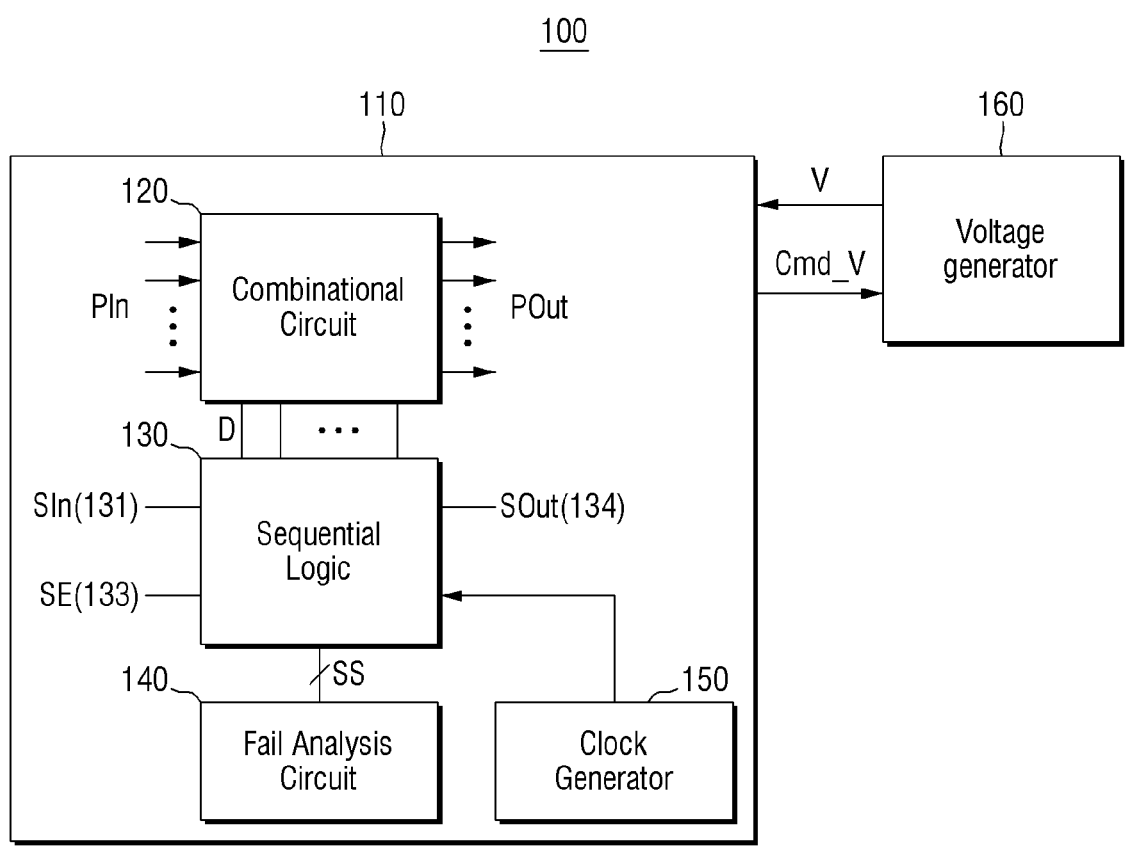
FIG. 1 is a block diagram of an electronic device including an integrated circuit according to some embodiments of the present inventive concept.

Hereinafter, embodiments according to the technical idea of the present invention will be described referring to the accompanying drawings. In the description of FIGS. 1 to 12, the same reference numbers are used for substantially the same components, and repeated explanation of the corresponding components will not be provided. Further, similar reference numerals are used for similar components throughout several drawings of the present invention. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

Figure 2:
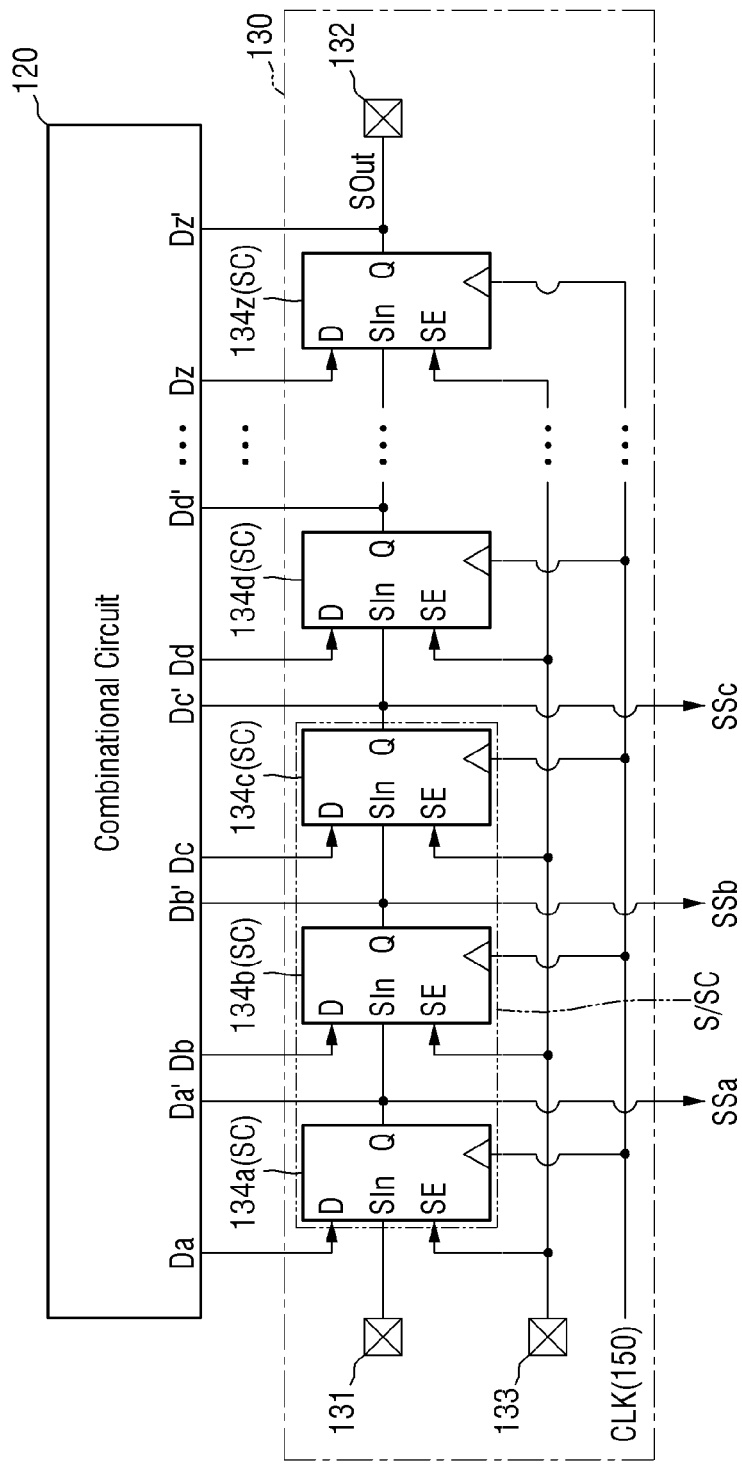
FIG. 2 is a circuit diagram, which shows a scan chain in the integrated circuit according to some embodiments of the present inventive concept.
Figure 3:
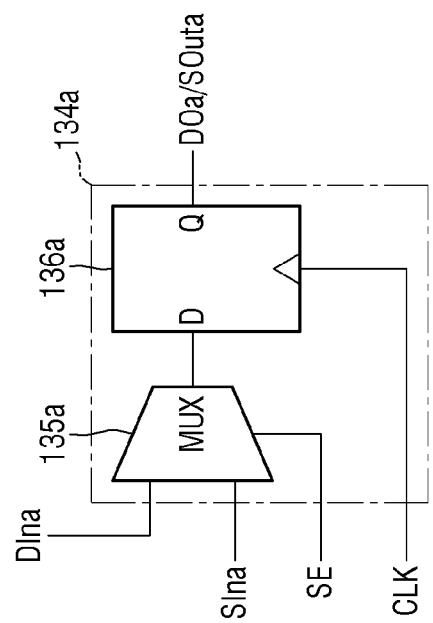
FIG. 3 is a diagram that illustrates a scan cell of FIG. 2.

FIG. 1 is a block diagram of an electronic device including an integrated circuit according to some embodiments of the present inventive concept. FIG. 2 is a circuit diagram, which shows a scan chain in the integrated circuit according to some embodiments of the present inventive concept. FIG. 3 is a diagram that illustrates a scan cell of FIG. 2.

An electronic device 100 may be an ATE (Automatic test equipment) or a semiconductor test device, as an example, and may be mounted in a laptop computer, a smart phone, a tablet PC, or a PDA (personal digital assistant), an EDA (enterprise digital assistant), a digital camera, a PMP (portable multimedia player), a PND (portable navigation device), a handheld game console, a mobile internet device (MID), a multimedia device, a wearable computer, an internet of things (IoT) device, an internet of everything (IoE) device, an e-book, a drone, an advanced drivers assistance system (ADAS), and/or an AR (Augmented reality) device, and the like, and may also be mounted in electronic devices that perform high-speed communication.

Referring to FIGS. 1 to 3, the electronic device 100 may include an integrated circuit 110 and a voltage generator 160, and the integrated circuit 110 may include a combination circuit 120, a sequential logic circuit 130, a fail analysis circuit 140, and a clock signal generator 150. In addition, the electronic device 100 may further include a display, a communication module, and the like. In an embodiment, the voltage generator 160 may be included in the integrated circuit 110.

The voltage generator 160 is provided with a voltage command Cmd_V from the integrated circuit 110, and may generate a drive voltage V corresponding to the voltage command Cmd_V and provide the drive voltage V to the integrated circuit 110.

The integrated circuit 110 may be integrated into one semiconductor chip or semiconductor module. The integrated circuit 110 may be implemented in a variety of ways including, but not limited to, as a system-on-chip (Soc), an application processor (AP), a mobile AP, and/or a control chip. Further, the integrated circuit 110 may be embodied in a variety of ways including, but not limited to, as a functional block, such as a CPU (central processing unit), a GPU (graphics processing unit), an NPU (Neural Network Processor), a CP (Communication Processor), each core of a multi-core processor, a PMU (power management unit), a CMU (clock management unit), a system BUS, a memory, a USB (universal serial bus), a PCI (peripheral component interconnect), a digital signal processor (DSP), a wired interface, a wireless interface, a controller, an embedded software module, a codec, a video module (e.g., camera interface, a JPEG (Joint Photographic Experts Group) processor, a video processor, or a mixer, etc.), a 3D graphic score, an audio system, and/or a driver.

The combination circuit 120 may include elements of the combination circuit whose output data are determined by a current data state of the input data, such as an inverter, an AND gate, a XOR gate, and/or an OR gate.

The combination circuit 120 may receive a plurality of input data PIn and provide a plurality of output data Pouts, and the data (Pins, Pouts), which are input and output through the combination circuit 120 may be provided to internal elements of the integrated circuit 110, but may also be provided outside of the integrated circuit 110, without being limited thereto.

The combination circuit 120 may perform a normal operation, and may input and output a plurality of normal data D to and from the sequential logic circuit 130 through the normal data input nodes Da to Dz and the normal data output nodes Da' to Dz'. When the combination circuit 120 performs the normal operation, a scan enable SE signal may be input (OFF) to the sequential logic circuit 130 at a logic low state.

The sequential logic circuit 130 may include a plurality of scan cells 134. The plurality of scan cells 134 may operate as elements of the sequential logic when the combination circuit 120 and the sequential logic circuit 130 perform the normal operation, and the elements included in the plurality of scan cells 134 may operate, for example, as flip-flops, latches, and the like. Further, when the sequential logic circuit 130 performs the test operation, the plurality of scan cells 134 may form a scan chain SC sequentially connected in series between the scan input pin 131 and the scan output pin 132. When the test operation on the sequential logic circuit 130 is performed, the scan enable SE signal may be input (ON) to the sequential logic circuit 130 at a logic high state.

The plurality of scans 134 may include scan cells, which are connected in series from a a-th scan cell 134a provided with a scan input Sin from the scan input pin 131 to a z-th scan cell 134z, which outputs a scan output SOut to the scan output pin 132. The symbols a to z are examples for facilitating descriptions of the embodiments of the inventive concept, and the examples do not limit the embodiments of the inventive concept described herein.

The plurality of scan cells 134 include a selection scan cell S/SC including a a-th scan cell 134a to a c-th scan cell 134c connected in series from the scan input pin 131. The outputs (SSa to SSc) of the selection scan cell S/SC may be provided to the fail analysis circuit 140 as the selection signal SS. The selection scan cells S/SC are scan cells placed in a previous stage of the scan chain SC, and are outputs with generally the lowest possibility of operation fail. For the z-th scan cell 134z of the last stage to achieve an operation pass, all the scan cells placed in the previous stage of the z-th scan cell 134z need to pass the operation. Accordingly, to secure the operation reliability of the fail analysis circuit 140, the selection scan cell S/SC may include the a-th scan cell 134a to the c-th scan cell 134c sequentially placed at the previous stage. Although the selection scan cells S/SC are shown as three scan cells in the drawing, this is an expression for facilitating the description of embodiments of the inventive concept. It will be understood that embodiments of the inventive concept are not limited thereto, and the selection scan cell S/SC may be implemented as N scan cells (N is a natural number of 2 or more).

Referring to FIG. 3, the a-th scan cell 134a may include a a-th multiplexer 135a and a a-th flip-flop 136a. The a-th multiplexer 135a is provided at the previous stage of the a-th flip-flop 136a, and may provide the a-th scan input SIna or the a-th normal input data Dina of the combination circuit 120 to the a-th flip-flop 136a.

When the combination circuit 120 and the sequential logic circuit 130 operates normally, the a-th flip-flop 136a may operate as a part of the sequential logic for implementing the unique function of the integrated circuit 110. At the time of the normal operation, an inactive level, for example, logic-low scan enable signal SE, is provided to the a-th multiplexer 135a, and the a-th multiplexer 135a provides the a-th normal input data Dina of the combination circuit 210 to the a-th flip-flop 136a in response to the scan enable signal SE, and the a-th normal output data DOa of the a-th flip-flop 136a may be provided to the combination circuit 120. Therefore, the a-th flip-flop 136a may operate to facilitate the unique function of the integrated circuit 110.

When the sequential logic circuit 130 performs the test operation, the a-th flip-flop 136a may output a b-th scan input SInb to the subsequent stage responsive to a received a-th scan input SIna. At the time of the test operation, an active level, for example, logic-high scan enable signal SE, is applied to the a-th multiplexer 135a, and the a-th multiplexer 135a may provide the a-th scan input SIa to the a-th flip-flop 136a.

The a-th scan cell 134a corresponds to the remaining plurality of scans 134b to 134z, and the description of the remaining plurality of scans 134b to 134z may be similar to that of the a-th scan cell 134a according to some embodiments of the inventive concept. However, the z-th scan cell 134z of the last stage may output the scan input SOut at the time of the test operation.

The scan input SIn is a data pattern having a plurality of bits, and the flip-flops in the plurality of scan cells 134a to 134z may shift-in the data pattern of the scan input SIn to the scan chain SC in response to the clock signal CLK. After that operation, when the scan enable signal SE of an inactive level is received for one cycle (e.g., one cycle of the clock signal CLK), the normal input data of the combination circuit 120 based on the data pattern are captured by the plurality of flip-flops.

When the scan enable signal SE of the active level is received again, the plurality of flip-flops may output the scan output SOut, by shifting-out the captured outputs in response to the clock signal CLK. The scan output SOut is generated based on the scan input SIn, the scan output SOut is also a data pattern having a plurality of bits, and the number of bits of the scan output SOut may be the same as the number of bits of the scan input SI.

The scan output Sout is predictable from the configuration of the scan input SI and the sequential logic circuit 130. Incidentally, when the sequential logic circuit 130 does not operate normally, for example, when a functional abnormality occurs in the elements of the combination circuit 120 or the scan cells 134a to 134z, the scan output SOut may include at least one error bit, that is, bits having different data from the predicted data.

In a manufacturing step of the integrated circuit 110 or a debugging step of the integrated circuit 110, a test device outside the integrated circuit 110 or the electronic device 100 may provide the scan input Sin and the scan enable signal SE to the scan chain SC through the input terminals 131 and 133 of the integrated circuit 110, and may analyze the scan output SOt received through the output terminal 132, that is, the error bits of the scan output SOut, thereby testing or debugging whether the integrated circuit 110 operates normally. The fail analysis circuit 140 may receive the selection signal SS and check whether a fail operation occurs at a specific node in the integrated circuit 110.

Figure 4:
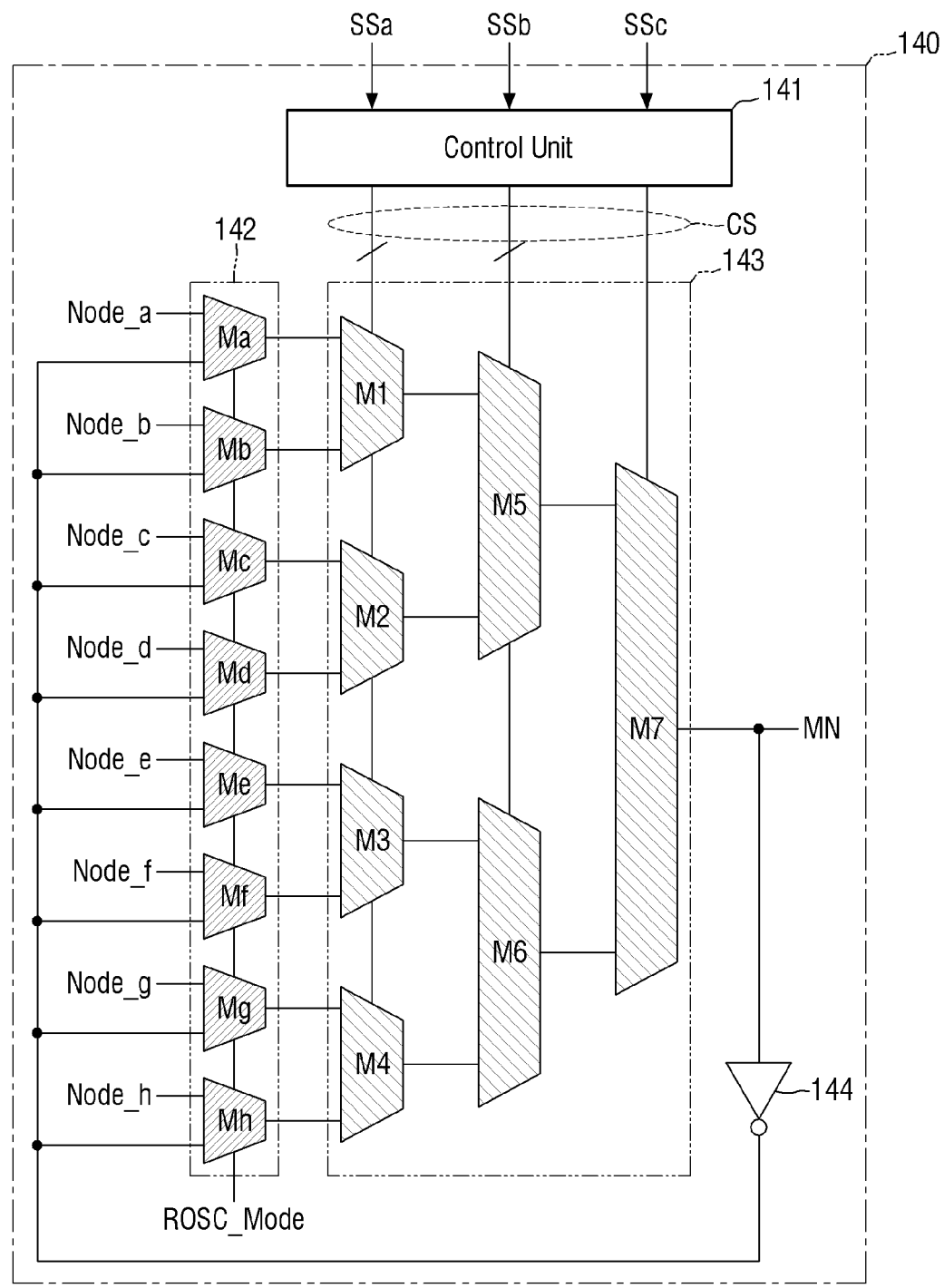
FIG. 4 is an example circuit diagram of a fail analysis circuit in the integrated circuit according to some embodiments of the present inventive concept.
Figure 5:
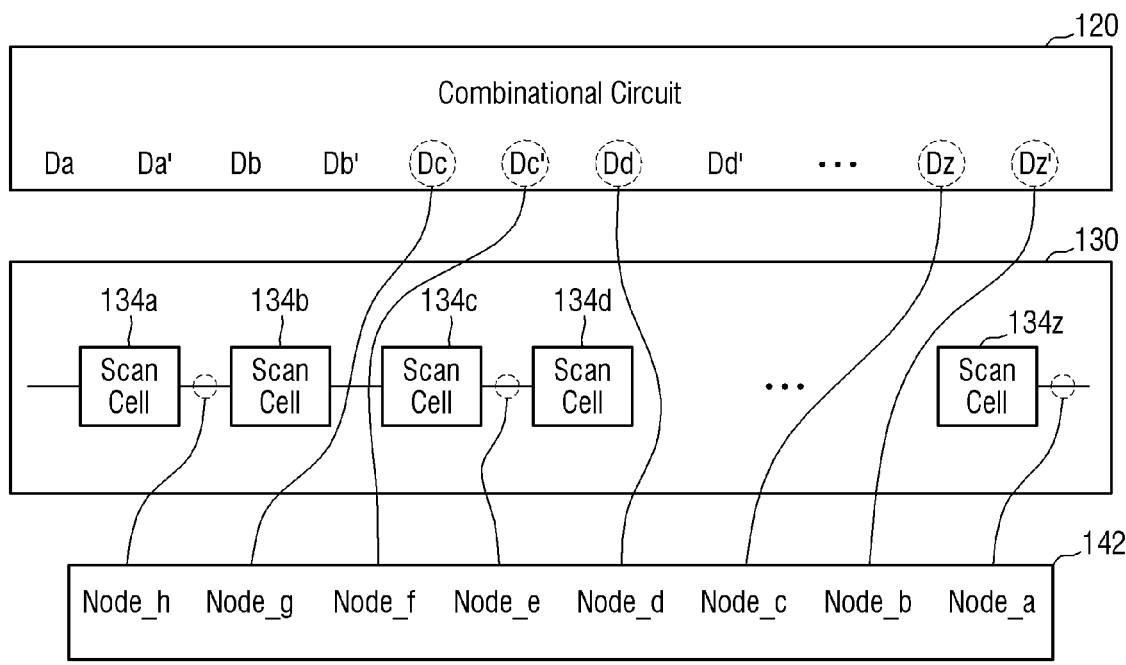
FIG. 5 is a diagram that illustrates the observation node monitored in the integrated circuit according to some embodiments of the present inventive concept.

FIG. 4 is an example circuit diagram of a fail analysis circuit in the integrated circuit according to some embodiments of the present inventive concept. FIG. 5 is a diagram that illustrates the observation node monitored in the integrated circuit according to some embodiments of the present inventive concept.

Referring to FIGS. 4 and 5, the fail analysis circuit 140 may include a control unit 141, a plurality of input multiplexers 142, a monitoring circuit 143, and an inverter 144.

The fail analysis circuit 140 monitors predetermined observation nodes Node_a to Node_h responsive to the provided selection signal SS, and performs a debugging operation on the nodes in the integrated circuit 110.

The control unit 141 may operate as a decoder, is provided with the selection signals SSa to SSc, generates a control signal CS responsive to the selection signals SSa to SSc, provides the control signal CS to the monitoring circuit 143, and controls the control signal CS.

The plurality of input multiplexers 142 may include the a-th to h-th input multiplexers Ma to Mh. The a-th to h-th input multiplexers Ma to Mh provide the data of each of the observation nodes Node_a to Node_h to be monitored to the monitoring circuit 143.

Therefore, the number of the plurality of input multiplexers 142 may be the same as the number of observation nodes, and the number of the plurality of input multiplexers 142 may be determined by the selection signal SS. As an example, by providing the fail analysis circuit 140 with three selection signals SSa to SSc, the monitoring circuit 143 may monitor eight observation nodes that do not overlap each other, and the fail analysis circuit 140 may include eight a-th to h-th input multiplexers Ma to Mh according to each observation node. That is, when N selection signals are provided to the fail analysis circuit 140, the monitoring circuit 143 may monitor $2^N$ observation nodes that do not overlap each other, and the fail analysis circuit 140 may include $2^N$ input multiplexers corresponding to each observation node (N is a natural number of 2 or more).

Referring to FIG. 5, each of the observation nodes Node_a to Node_h to be monitored may be an arbitrary node placed in the combination circuit 120 or the sequential logic circuit 130. That is, each of the observation nodes Node_a to Node_h may be defined by the circuit designer.

As an example, referring to FIG. 5, the a-th observation node Node_a is an output node of the z-th scan cell 134z, the b-th observation node Node_b is a z-th normal data output node Dz', the c-th observation node Node_c is a z-th normal data input node Dz, the d-th observation node Node_d is a d-th normal data input node Dd, the e-th observation node Node_e is an output node of the c-th scan cell 134c, the f-th observation node Node_f is a c-th normal data output node Dc', the g-th observation node Node_f is a c-th normal data input node Dc, and the h-th observation node Node_h is an output node of the a-th scan cell 134a. The example of the observation node arrangement FIG. 5 is an example of an analysis of the fail analysis circuit 140, and the example of the observation node arrangement does not limit the embodiments of the inventive concept.

The monitoring circuit 143, together with the plurality of input multiplexers 142, performs a self-check operation or a monitoring operation on the data of each of the observation nodes Node_a to Node h.

The monitoring circuit 143 may include first to seventh selection multiplexers M1 to M7. The first to seventh selection multiplexers M1 to M7 are selected in response to the control signal CS, and the self-check operation or the monitoring operation on the data of each of the observation nodes Node_a to Node_h may be performed according to the selection. The control signal CS is individually supplied to the selection multiplexers M1 to M7.

The number of selection multiplexers in the monitoring circuit 143 is less by one than the number of observation nodes monitored by the monitoring circuit 143, and thus, the number of selection multiplexers in the monitoring circuit 143 may also be determined by the selection signal. As an example, because the fail analysis circuit 140 is provided with three selection signals SSa to SSc, the monitoring circuit 143 may monitor eight observation nodes that do not overlap each other, and the monitoring circuit 143 may include seven selection multiplexers. That is, when N selection signals are provided to the fail analysis circuit 140, the monitoring circuit 143 may monitor the $2^N$ observation nodes that do not overlap each other, and to this end, the monitoring circuit 143 may include $2^N-1$ selection multiplexers (N is a natural number of 2 or more).

The plurality of input multiplexers 142 receive the inverted signal of the monitoring node MN of the monitoring circuit 143, together with the data of each of the observation nodes Node_a to Node_h to be monitored. The plurality of input multiplexers 142 provide the monitoring circuit 143 with data of each of the observation nodes Node_a to Node_h monitored in response to an oscillation mode signal ROSC_Mode, which is a verification signal, or a signal inverted by the inverter 144 in the monitoring node MN.

When the oscillation mode signal ROSC_Mode is input (ON) at a logic high state, a self-check operation on the monitor circuit 143 is performed.

The self-check operation verifies the operation pass in a path placed between the plurality of input multiplexers 142 and the monitoring node MN. As an example, when the self-check operation is performed in the path between the first input multiplexer 142 and the monitoring node MN, the first, fifth, and seventh selection multiplexers M1, M5 and M7 may be selected on the basis of the control signal CS. If the operation pass is achieved in the path of the first input multiplexer 142 and the first, fifth, and seventh selection multiplexers M1, M5, and M7, the a-th input multiplexer 142 and the first, fifth, and seventh selection multiplexers M1, M5, and M7 operate by the delay element, and an oscillation signal in which the signal is continuously inverted at a fixed cycle by the inverter 144 is detected in the monitoring node MN.

When the oscillation mode signal ROSC_Mode is input (OFF) at a logic low state, the data of each of the observation nodes Node_a to Node_h may be detected in the monitoring node MN responsive to the control signal CS of the monitoring circuit 143. As an example, when the a-th observation node Node_a is monitored, the first, fifth, and seventh selection multiplexers M1, M5, and M7 are selected responsive to the control signal CS, and the data of the a-th observation node Node_a is detected in the monitoring node MN. The debugging operation on the a-th observation node Node_a may be performed through the detection of the monitoring node MN.

Figure 6:
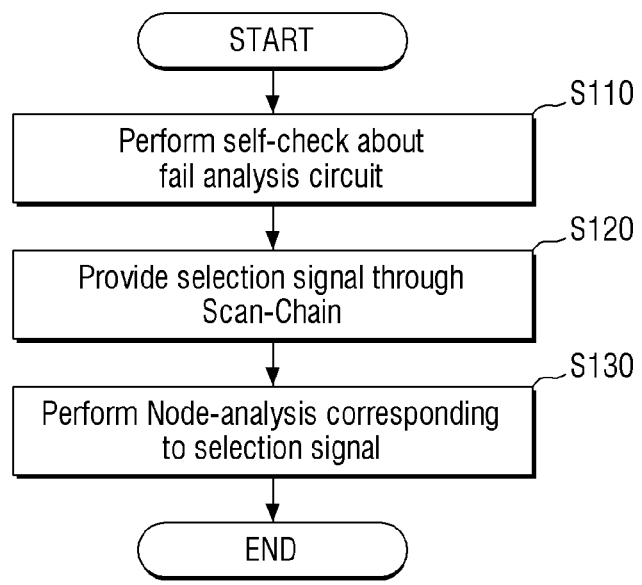
FIG. 6 is a flowchart that illustrates the driving method of the fail analysis circuit in the integrated circuit according to some embodiments of the present inventive concept.
Figure 7:
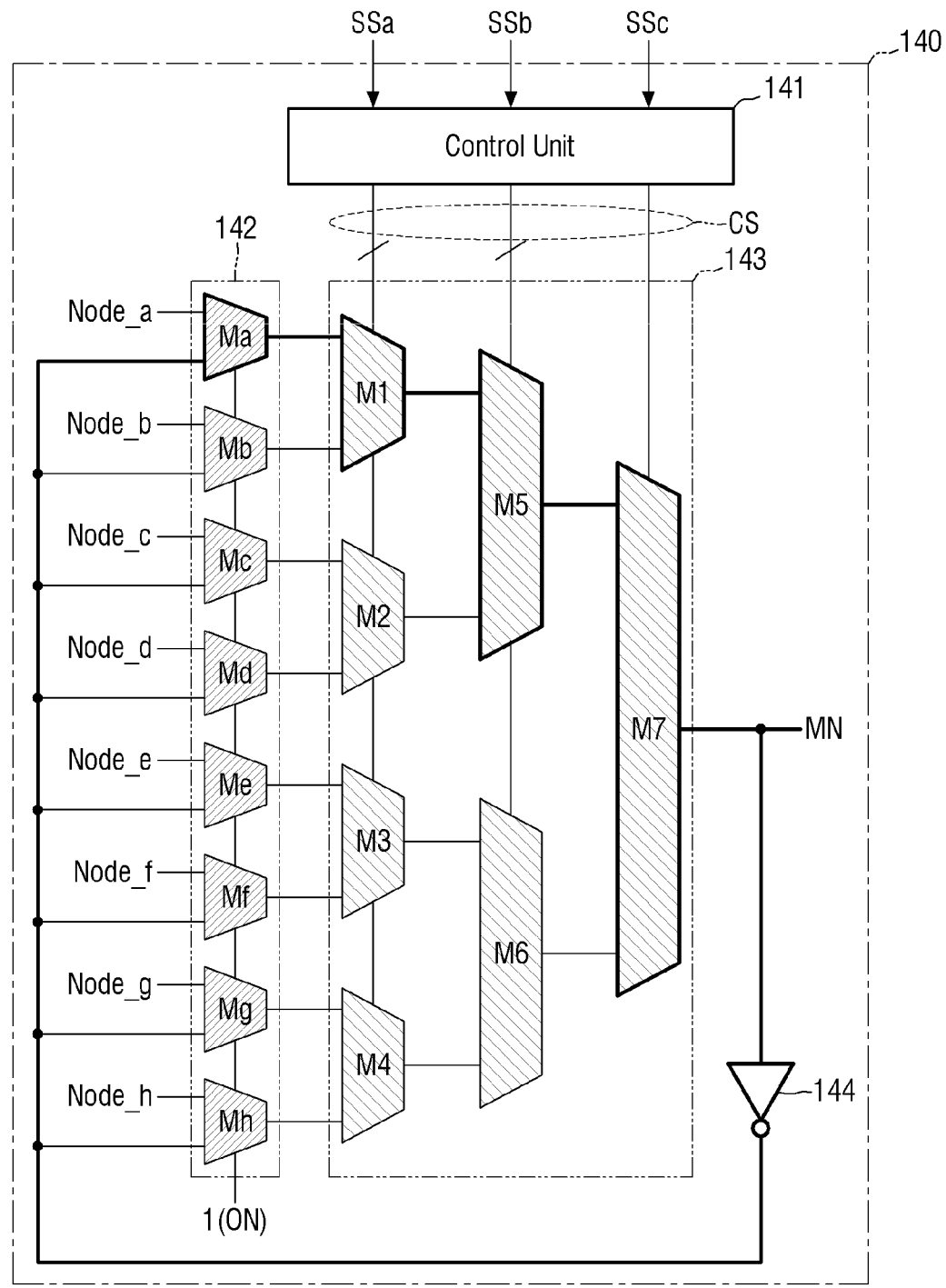
FIGS. 7 to 9 are diagrams that illustrate the driving method of the fail analysis circuit in the integrated circuit according to some embodiments of the present inventive concept.
Figure 8:
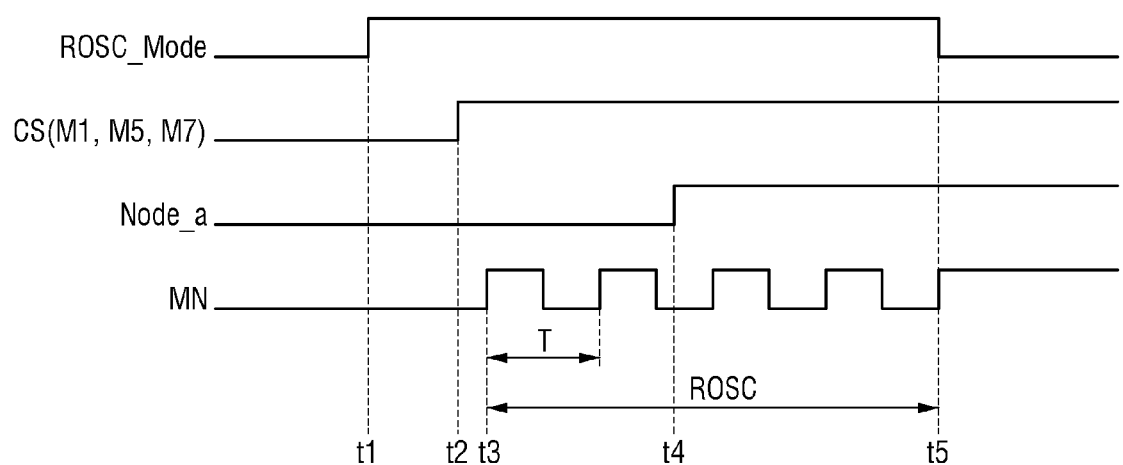
Figure 9:
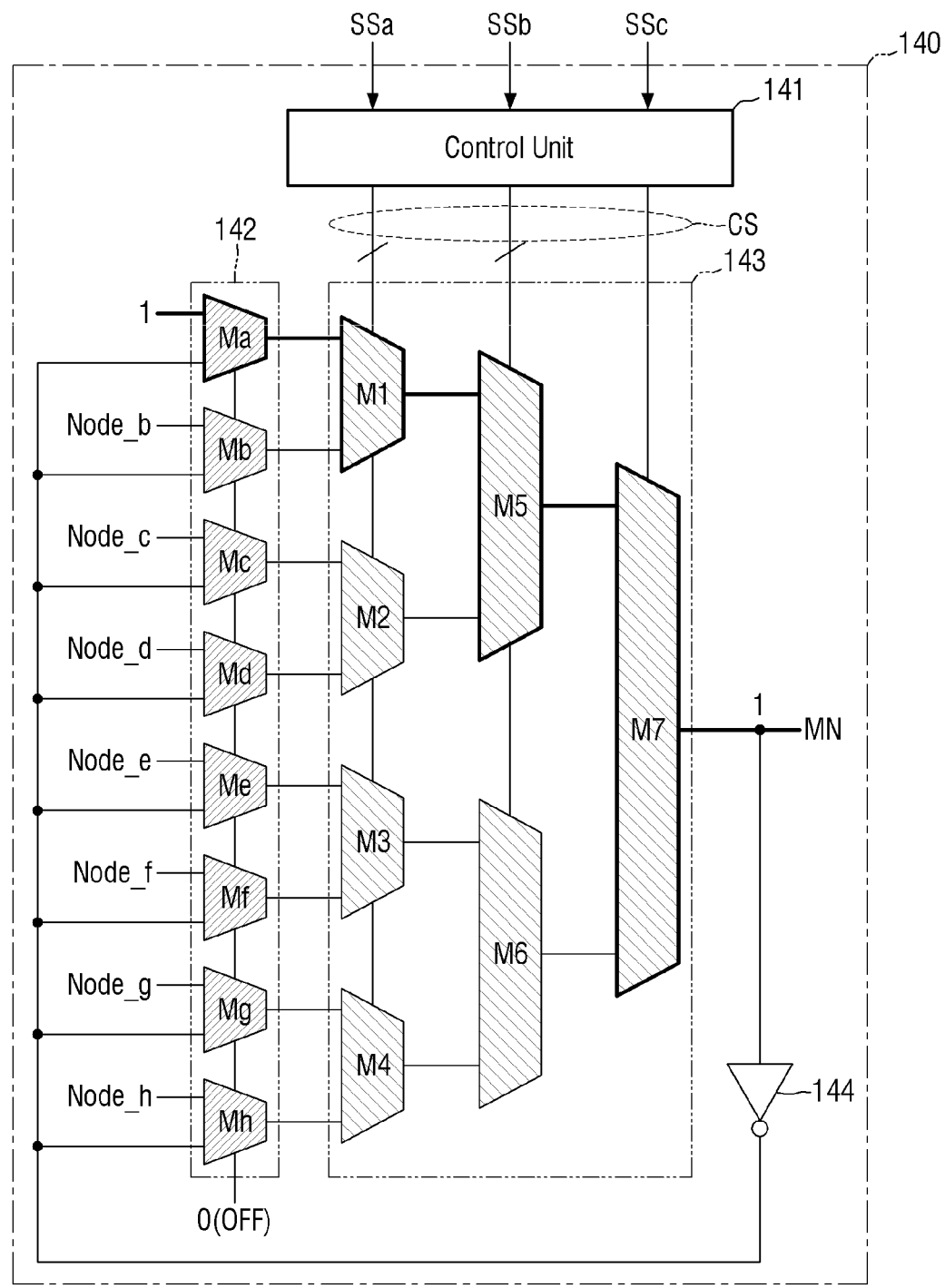

FIG. 6 is a flowchart that illustrates operations of the driving method of the fail analysis circuit in the integrated circuit according to some embodiments of the present inventive concept. FIGS. 7 to 9 are diagrams that illustrate operations of the driving method of the fail analysis circuit in the integrated circuit according to some embodiments of the present invention.

Referring to FIG. 6, the self-check operation of the fail analysis circuit 140 may be performed using the oscillation mode signal ROSC_Mode (S110).

Further referring to FIGS. 7 and 8, the oscillation mode signal ROSC_Mode is input (ON) to the plurality of input multiplexers 142 at a logic high state at a first time t1.

At a second time t2, the first, fifth and seventh selection transistors M1, M5 and M5 may be selected using the control signal CS. The oscillation mode signal ROSC_Mode and the control signal CS form a closed circuit by the a-th input multiplexer Ma-first, the fifth and seventh selection transistors M1, M5, and M7, and the inverter 144. The a-th input multiplexer Ma—the first, fifth and seventh selection transistors M1, M5, and M7 operate only with the delay element by the oscillation mode signal ROSC_Mode and the control signal CS, and an oscillation signal ROSC in which the signal is continuously inverted in the monitoring node MN at a fixed cycle T is detected beginning at the third time t3.

When the oscillation signal is detected, even if it is input at a logic high state in the a-th observation node Node_a, it does not affect the signal detection of the monitoring node MN by the oscillation mode signal ROSC_Mode.

When the oscillation mode signal ROSC_Mode is input (OFF) to the plurality of input multiplexers 142 at a logic low state at a fifth time t5, the oscillation signal detection of the monitoring node MN is stopped.

A self-check operation between the b-th to h-th input multiplexers Mb to Mh and the monitoring node MN may be performed responsive to the control signal CS, and the self-check operation may be similar to the self-check operation between the a-th input multiplexer Ma and the monitoring node MN.

Further referring to FIG. 9, the selection transistors M1 to M7 may be selected using the control signal CS corresponding to the selection signal SS (S120).

As an example, when the oscillation mode signal ROSC_Mode is input (OFF) to a plurality of input multiplexers 142 at a logic low state after the self-check operation is completed, the first, fifth, and seventh selection transistors M1, M5, and M7 may be selected using the control signal CS to monitor the a-th observation node Node_a.

The node analysis, that is, debugging may be performed on the observation node through the control signal CS corresponding to the selection signal SS (S130). As an example, the data of the a-th observation node Node_a may be detected in the monitoring node MN of the monitoring circuit 143. Debugging may be performed on the a-th observation node Node_a through the detection.

The node analysis of the b-th to h-th observation nodes Node_b to Node_h may also be performed through the control signal CS corresponding to the selection signal SS, like the node analysis on the a-th observation node Node_a. Therefore, the description of the node analysis of the b-th to h-th observation nodes Node_b to Node_h may be similar to the description of the node analysis of the a-th observation node Node_a.

Figure 10:
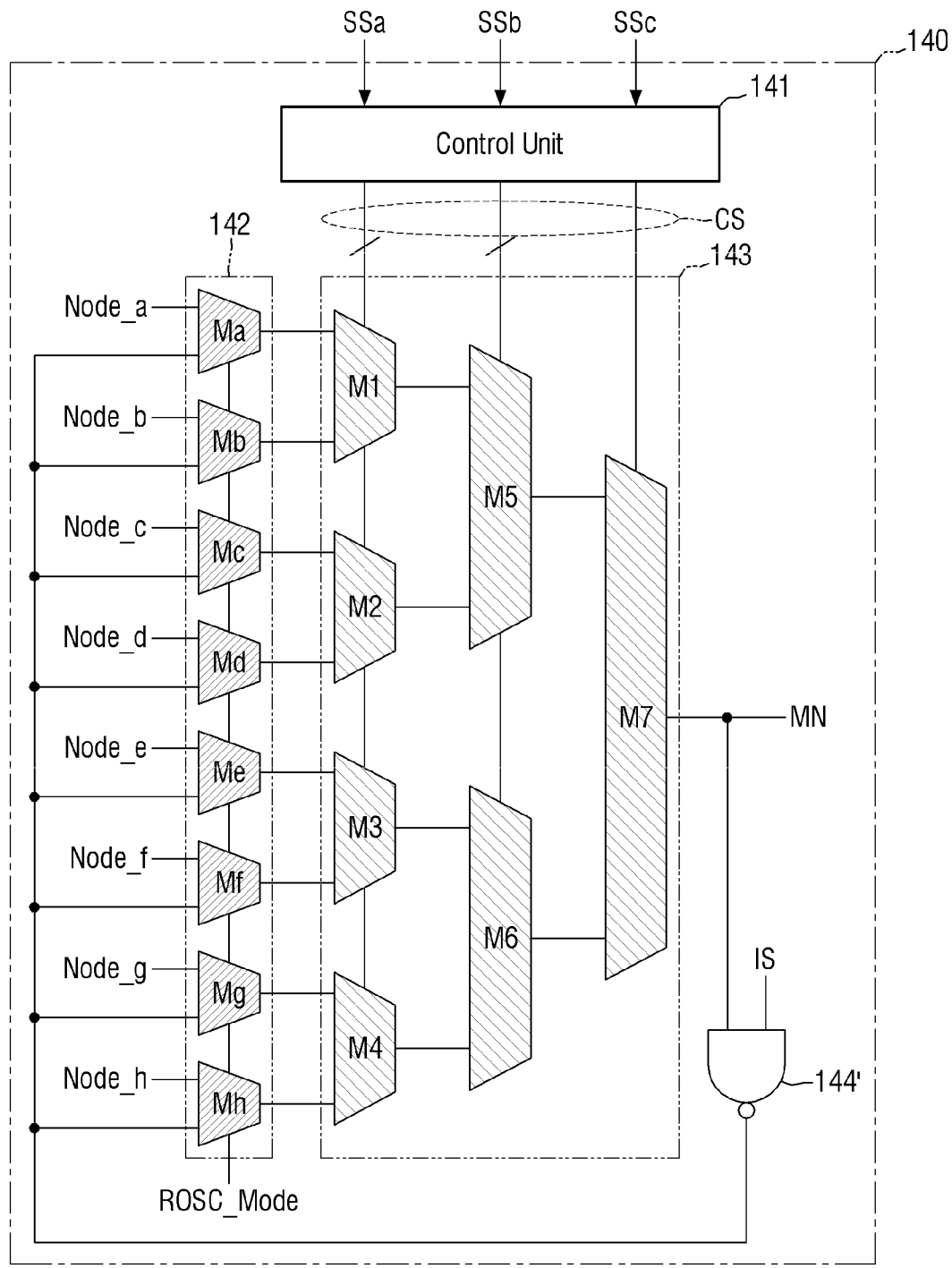
FIG. 10 is an example circuit diagram of a fail analysis circuit inside the integrated circuit according to some other embodiments of the present inventive concept.

FIG. 10 is an example circuit diagram of a fail analysis circuit inside the integrated circuit according to some other embodiments of the present inventive concept. For convenience of explanation, the features that are different from those described with reference to FIG. 4 will be mainly described in referring to FIG. 10

A fail analysis circuit 140 of FIG. 10 includes a NAND calculator 144' instead of the inverter 144. The NAND calculator 144' may perform the inversion operation of the inverter 144 of FIG. 4 by controlling the invert control signal IS. In addition to the embodiment of FIG. 10, it may be applicable to all embodiments that perform the same inversion operation as the inverter.

Figure 11:
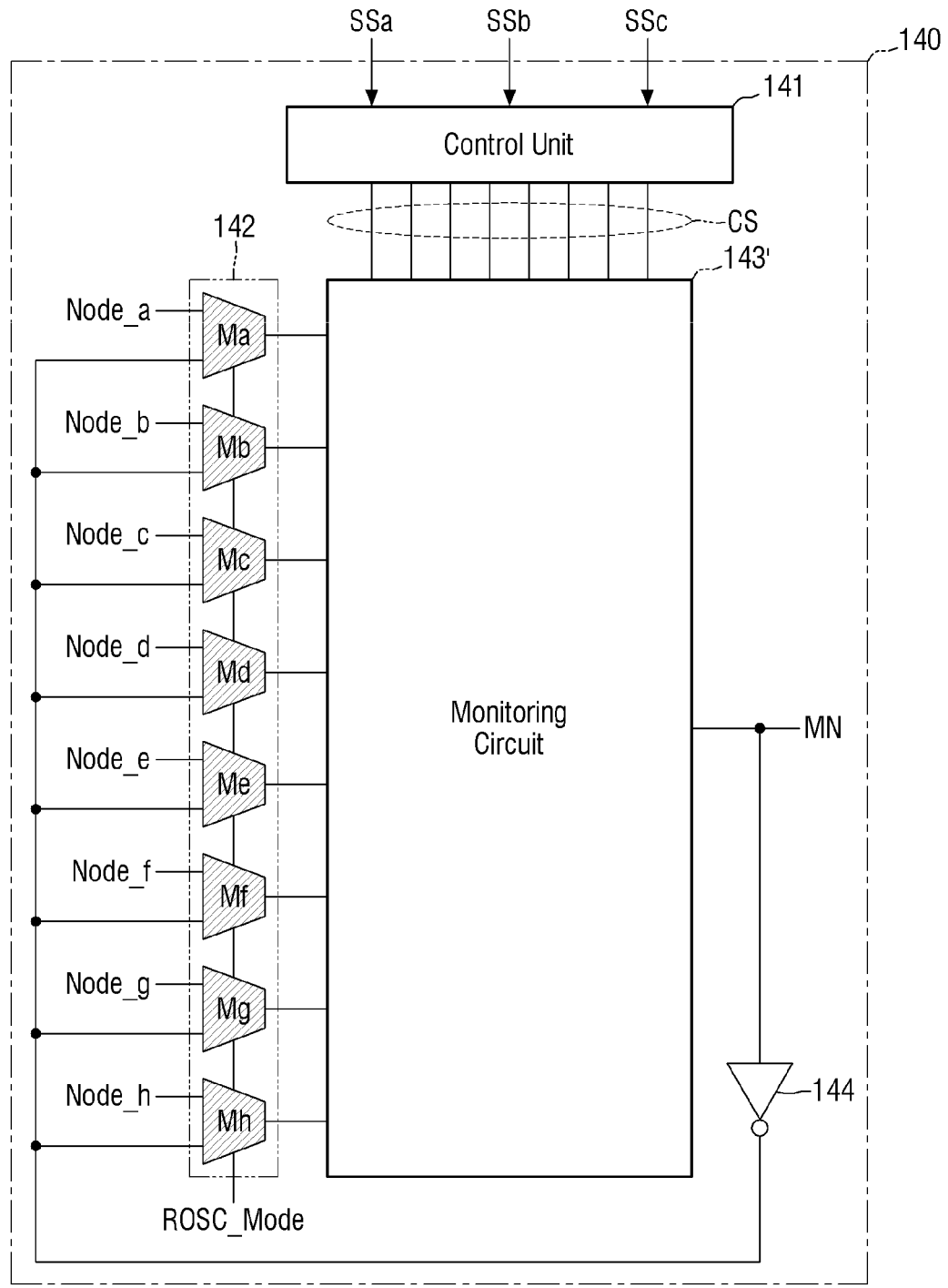
FIG. 11 is an example circuit diagram of a fail analysis circuit inside the integrated circuit according to some other embodiment of the inventive concept.

FIG. 11 is an example circuit diagram of a fail analysis circuit inside the integrated circuit according to some other embodiments of the inventive concept. For convenience of explanation, the features that are different from those described in FIG. 4 will be mainly described in referring to FIG. 11.

Unlike the monitoring circuit 143 of FIG. 4, the fail analysis circuit 140 of FIG. 11 may include a monitoring circuit 143' made up of a combination of an inverter, an AND gate, an XOR gate or a logic element of an OR gate, as well as a multiplexer.

The monitoring circuit 143' is provided with a plurality of control signals CS, and may perform the self-check operation and the monitoring operation on the observation node using the control signal CS.

Figure 12:
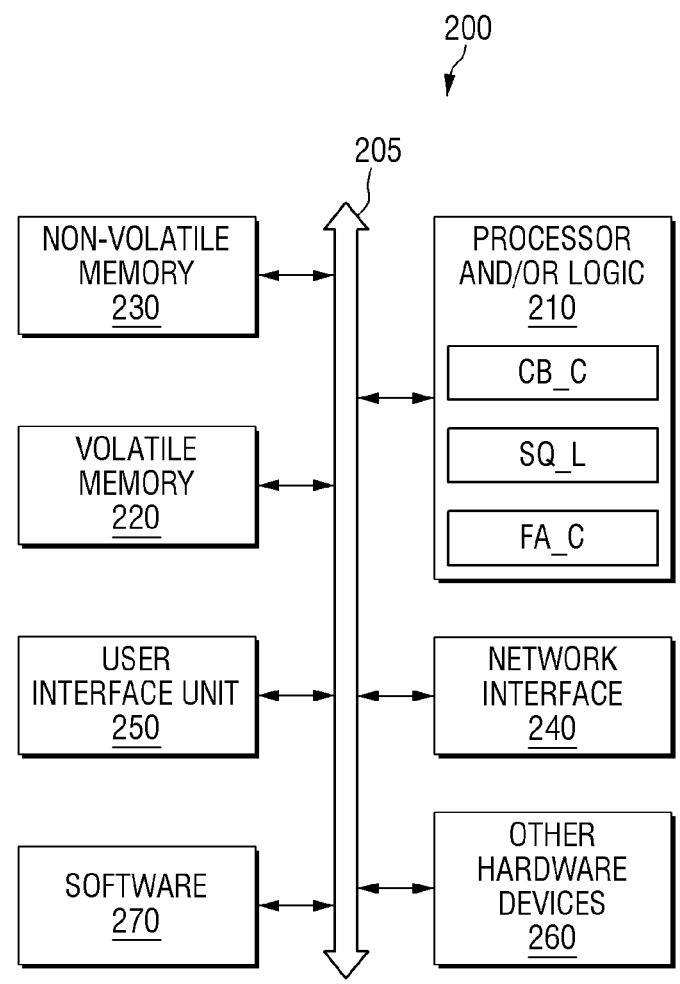
FIG. 12 is a block diagram of an electronic device according to some embodiments of the present inventive concept.

FIG. 12 is a block diagram of an electronic device according to some embodiments of the present inventive concept.

An electronic device 200 may include one or more devices configured according to embodiments of the inventive concept. In some embodiments, the electronic device 200 may use or implement one or more techniques according to the embodiments described herein.

In various embodiments, the electronic device 200 may include, for example, a computing device, such as, a laptop, a desktop, a workstation, a server, a blade server, a personal digital assistant (PDA), a smartphone, a tablet, and other suitable computers, or virtual machines, and/or virtual computing devices thereof. In various embodiments, the electronic device 200 may be used by a user (not shown).

The electronic device 200 according to some embodiments of the present inventive concept may include a central processing unit (CPU), logic, and/or a processor 210. In some embodiments, the processor 210 may include one or more sequential logics SQ_L or combination circuits CB_C and a fail analysis circuit FA_C. The sequential logics SQ_L or the combination circuits CB_C and the fail analysis circuit FA_C may correspond to the sequential logic circuit 130 or the combination circuit 120 and the fail analysis circuit 140 of FIGS. 1 to 11.

In such an embodiment, the combination circuits CB_C may include various Boolean logic computation (e.g., NAND, NOR, NOT, and XOR), stabilizing logic devices (e.g., flip-flop and latch), other logic devices, or combinations thereof. Such combinatorial logic operations may be configured to process an input signal and achieve a desired result in a simple or complex way. Although some examples of the synchronous combination logic operations have been described, it will be appreciated that embodiments of the present inventive concept are not limited thereto, and asynchronous operations or combinations thereof may be included in embodiments of the present inventive concept. In an embodiment, the combination logic operations may include a plurality of CMOS (Complementary Metal Oxide Semiconductor) transistors. It will be appreciated that such CMOS transistors may be aligned with gates that perform logical operations in various embodiments, and other techniques may be included or used within the scope of embodiments of the present inventive concept.

The electronic device 200 according to embodiments of the present inventive concept may further include a volatile memory 220 (e.g., a random access memory (RAM)). The electronic device 200 according to embodiments of the present inventive concept may further include a non-volatile memory 230 (e.g., a hard drive, an optical memory, a NAND or a flash memory). In some embodiments, one of the volatile memory 220, the non-volatile memory 230, and combinations or some of these components may be referred to as a "storage medium." In various embodiments, the volatile memory 220 and/or the non-volatile memory 230 may be configured to store data in a semi-permanent form or in a substantially permanent form.

In various embodiments, the electronic device 200 may include one or more network interfaces 240 configured to allow the electronic device 200 to communicate with a part thereof through a communication network. Examples of Wi-Fi protocols may include, but are not limited to, an IEEE (Institute of Electrical and Electronics Engineers) 802.11g and an IEEE 802.11n. Examples of the cellular protocols may include, but are not limited to, an IEEE 802.16m (also known as a Wireless-MAN (Wireless-Metropolitan Area Network)) Advanced, a LTE (Long Term Evolution) Advanced, an EDGE (Enhanced Data rates for GSM (Global System for Mobile Communications) Evolution), and a HSPA+ (Evolved High-Speed Packet Access). Examples of the wired protocols may include, but are not limited to, an IEEE 802.3 (also known as Ethernet), a Fiber Channel, and a power line communication (e.g., HomePlug, IEEE 1901). It will be appreciated that the above communication protocols are merely examples and embodiments of the present inventive concept are not limited thereto.

The electronic device 200 according to embodiments of the present inventive concept may further include a user interface unit 250 (e.g., a display adapter, a haptic interface, a human interface device, and the like). In various embodiments, the user interface unit 250 may be configured to receive input from the user or provide output to the user. Other types of devices may be used to provide the communication with the user. For example, the feedback provided to the user may be in the form of sensory feedback such as a visual feedback, a voice feedback, and a tactile feedback, and the input from the user may be received in a form including voice, sound, and tactile input.

In various embodiments, the electronic device 200 may include one or more other devices or hardware configurations 260 (e.g., a display or a monitor, a keyboard, a mouse, a camera, a fingerprint recognition device, a video processor, and the like). The above configurations are merely examples and it will be easily understood that embodiments of the present inventive concept are not limited thereto.

The electronic device 200 according to embodiments of the present inventive concept may further include one or more system buses 205. In such embodiments, the system bus 205 may be configured to communicatively connect the processor 210, the volatile memory 220, the non-volatile memory 230, the network interface 240, the user interface unit 250, and one or more hardware configurations 260. The data processed by the processor 210 or the data that is input from the outside of the non-volatile memory 230 may be stored in either the non-volatile memory 230 or the volatile memory 220.

Although embodiments of the present disclosure have been described above with reference to the accompanying drawings, it will be understood by those of ordinary skill in the art that the present disclosure is not limited thereto and may be implemented in many different forms without departing from the technical idea or essential features thereof. Therefore, it should be understood that the embodiments set forth herein are merely examples in all respects and not restrictive.

What is claimed is:

1. An integrated circuit comprising:
  a sequential logic circuit, which includes a first scan cell that is configured to receive a scan input, and a plurality of scan cells sequentially connected in series from the first scan cell;
  a control unit, which is configured to receive a selection signal comprising an output of each of the plurality of scan cells, and is further configured to output a control signal responsive to the selection signal;
  a monitoring circuit, which is configured to receive the control signal, is configured to perform first monitoring of first data at a first node that is an observation node in the sequential logic circuit responsive to the control signal, and is configured to output a result of the first monitoring to a monitoring node;
  an input multiplexer, which is configured to receive the first data and data corresponding to the first monitoring, and is configured to output one of the first data or the data corresponding to the first monitoring responsive to a verification signal that is received; and
  an inverter that is coupled between the monitoring node and the input multiplexer and is configured to invert the result of the first monitoring.

2. The integrated circuit of claim 1, further comprising:
  a combination circuit, which includes a second node, that is the observation node, and is configured to output second data and normal data at the second node,
  wherein the sequential logic circuit is configured to receive the normal data, and
  wherein the monitoring circuit is configured to perform second monitoring of the second data at the second node responsive to the control signal, and is configured to output a result of the second monitoring to the monitoring node.

3. The integrated circuit of claim 1, wherein the input multiplexer is configured to output the data corresponding to the first monitoring and an oscillation signal is continuously inverted at a fixed cycle and is output at the monitoring node responsive to the verification signal being in a logic high state.

4. The integrated circuit of claim 1, wherein the input multiplexer is configured to output the first data responsive to the verification signal being in a logic low state.

5. The integrated circuit of claim 1, wherein the monitoring circuit includes a plurality of selection multiplexers,
  wherein at least one of the plurality of selection multiplexers is selected responsive to the control signal, and
  wherein the first data is output to the monitoring node through the at least one selection multiplexer.

6. The integrated circuit of claim 5, wherein outputs of the first scan cell to an n-th scan cell, which are sequentially connected among the plurality of scan cells, are input to the control unit,
  wherein the plurality of selection multiplexers includes $2^N-1$ selection multiplexers, and
  wherein the N is a natural number of 2 or more.

7. The integrated circuit of claim 1, wherein the outputs of the first scan cell to the n-th scan cell, which are sequentially connected among the plurality of scan cells, are input to the control unit,
  wherein the monitoring circuit is configured to monitor $2^N$ observation nodes, and
  wherein the N is a natural number of 2 or more.

8. An integrated circuit comprising:
  a combination circuit, which includes a first node that is an observation node, and is configured to output first data and normal data at the first node,
  a sequential logic circuit, which is configured to receive the normal data, and includes a first scan cell that is configured to receive a scan input, and a plurality of scan cells that are sequentially connected in series from the first scan cell;
  a control unit, which is configured to receive a selection signal comprising an output of each of the plurality of scan cells, and is configured to output a control signal responsive to the selection signal; and
  a monitoring circuit which is configured to receive the control signal, is configured to perform first monitoring on the first data at the first node responsive to the control signal, and is configured to output a result of the first monitoring to a monitoring node;
  an input multiplexer, which is configured to receive the first data and data corresponding to the first monitoring, and is configured to output one of the first data or the data corresponding to the first monitoring responsive to a verification signal that is received; and
  an inverter that is coupled between the monitoring node and the input multiplexer and is configured to invert the result of the first monitoring.

9. The integrated circuit of claim 8, wherein the monitoring circuit is further configured to perform second monitoring on second data at a second node inside the sequential logic circuit responsive to the control signal, and is configured to output a result of the second monitoring to the monitoring node.

10. The integrated circuit of claim 8, wherein the input multiplexer is configured to output the data corresponding to the first monitoring and an oscillation signal is continuously inverted at a fixed cycle is output at the monitoring node responsive to the verification signal being in a logic high state.

11. The integrated circuit of claim 8, wherein the monitoring circuit includes a plurality of selection multiplexers, wherein at least one of the plurality of selection multiplexers is selected responsive to the control signal, and wherein the first data is output to the monitoring node through the at least one selection multiplexer.

12. The integrated circuit of claim 8, wherein the outputs of the first scan cell to an n-th scan cell, which are sequentially connected among the plurality of scan cells, are input to the control unit, wherein the monitoring circuit is configured to monitor $2^N$ observation nodes, and wherein the N is a natural number of 2 or more.

13. An electronic device comprising:

an integrated circuit; and a power generator which is configured to provide power to the integrated circuit, and wherein the integrated circuit includes:

a sequential logic circuit, which includes a first scan cell that is configured to receive a scan input and a plurality of scan cells sequentially connected in series from the first scan cell;

a control unit, which is configured to receive a selection signal comprising an output of each of the plurality of scan cells, and is further configured to output a control signal responsive to the selection signal; and a monitoring circuit, which is configured to receive the control signal, is configured to perform first monitoring of first data at a first node that is an observation node in the sequential logic circuit responsive to the control signal, and is configured to output a result of the first monitoring to a monitoring node;

an input multiplexer, which is configured to receive the first data and data corresponding to the first monitoring, and is configured to output one of the first data or the data corresponding to the first monitoring responsive to a received verification signal; and an inverter that is coupled between the monitoring node and the input multiplexer and is configured to invert the result of the first monitoring.

14. The electronic device of claim 13, wherein the integrated circuit further includes a combination circuit, which includes a second node, that is an observation node, and is configured to output second data and normal data at the second node, wherein the sequential logic circuit is configured to receive the normal data, and wherein the monitoring circuit is configured to perform second monitoring of the second data at the second node responsive to the control signal, and is configured to output a result of the second monitoring to the monitoring node.

15. The electronic device of claim 13, wherein the outputs of the first scan cell to an n-th scan cell, which are sequentially connected among the plurality of scan cells, are input to the control unit, wherein the monitoring circuit is configured to monitor $2^N$ observation nodes, and wherein the N is a natural number of 2 or more.

16. The electronic device of claim 13, wherein the scan input is input to the integrated circuit through an input pad.

* * * * *